(12) United States Patent
Devience et al.

(10) Patent No.: US 10,101,423 B2
(45) Date of Patent: Oct. 16, 2018

(54) CREATION OF NEARLY-EQUIVALENT NUCLEAR SPIN SINGLET STATES USING SPIN-LOCK INDUCED CROSSING

(71) Applicant: President and Fellows of Harvard College, Cambridge, MA (US)

(72) Inventors: Stephen J. Devience, Cambridge, MA (US); Ronald L. Walsworth, Newton, MA (US); Matthew S. Rosen, Cambridge, MA (US)

(73) Assignee: President and Fellows of Harvard College, Cambridge, MA (US)

(*) Notice: Subject to any disclaimer, the term of this patent is extended or adjusted under 35 U.S.C. 154(b) by 453 days.

(21) Appl. No.: 14/774,852

(22) PCT Filed: Mar. 3, 2014

(86) PCT No.: PCT/US2014/019897
§ 371 (c)(1),
(2) Date: Sep. 11, 2015

(87) PCT Pub. No.: WO2014/164012
PCT Pub. Date: Oct. 9, 2014

(65) Prior Publication Data
US 2016/0041241 A1    Feb. 11, 2016

Related U.S. Application Data (60) Provisional application No. 61/780,033, filed on Mar. 13, 2013.

(51) Int. Cl.
*G01R 33/46* (2006.01)
*G01R 33/34* (2006.01)

(52) U.S. Cl.
CPC ... *G01R 33/4608* (2013.01); *G01R 33/34092* (2013.01)

(58) Field of Classification Search
CPC .............. G01R 33/4608; G01R 33/34092
See application file for complete search history.

(56) References Cited

U.S. PATENT DOCUMENTS

| | | | | |
|---|---|---|---|---|
| 4,345,207 A | * | 8/1982 | Bertrand | G01R 33/46 324/308 |
| 6,472,870 B1 | * | 10/2002 | Bendall | G01R 33/4608 324/307 |

(Continued)

OTHER PUBLICATIONS

Grzesiek et al, Spin-locked mulitple quantum coherence for signal enhancement in heteronuclear multidimensional NMR experiments, Aug. 13, 1995, Journal of Biomolecular NMR, 6(1995), 335-339.*

(Continued)

*Primary Examiner* — Jermele M Hollington
(74) *Attorney, Agent, or Firm* — Wilmer Cutler Pickering Hale and Dale LLP (57) ABSTRACT

Methods and systems for Nuclear Magnetic Resonance (NMR) spectra of samples having unresolved peaks are described. The methods and systems allow for the creation nuclear spin singlet states in nearly-equivalent spin pairs, for example, using continuous spin-locking with a nutation frequency matched to the coupling strength between spins. The invention relates generally to the field Nuclear Magnetic Resonance (NMR). Nuclear magnetic resonance (NMR) spectroscopy can be used as a tool for determining the chemical structure and/or geometry of a molecule in a sample. In many samples, however, resonance frequencies of different nuclei fully or partially overlap, which makes chemical identification of molecule(s) in a sample difficult or impossible.

7 Claims, 9 Drawing Sheets

(56) References Cited

U.S. PATENT DOCUMENTS

| | | | |
|---|---|---|---|
| 7,187,173 B1* | 3/2007 | Raftery | G01R 33/30 |
| | | | 324/318 |
| 8,362,770 B2 | 1/2013 | Vasos et al. | |
| 9,804,239 B2* | 10/2017 | Walsworth | G01R 33/465 |
| 2004/0257075 A1 | 12/2004 | An et al. | |
| 2013/0021031 A1 | 1/2013 | Bodenhausen et al. | |
| 2014/0012129 A1* | 1/2014 | Lohman | G01R 33/5601 |
| | | | 600/420 |
| 2015/0064113 A1* | 3/2015 | Warren | A61K 49/10 |
| | | | 424/9.3 |
| 2017/0326258 A1* | 11/2017 | Warren | A61K 49/10 |

OTHER PUBLICATIONS

Feng, Y., et al., "Accessing long-lived nuclear singlet states between chemically equivalent spins without breaking symmetry," Nature Physics, vol. 8, pp. 831-837,15 pages (Nov. 2012).

International Search Report and Written Opinion issued by the U.S. Patent and Trademark Office as International Searching Authority for International Application No. PCT/US2014/019897 dated Jun. 17, 2014 (8 pages).

Levitt, Malcolm H., "Singlet and Other States with Extended Lifetimes," Encyclopedia in Nuclear Magnetic Resonance, 74 pages—entire document (Mar. 2010).

Pileio, G., et al., "Storage of nuclear magnetization as long-lived singlet order in low magnetic field," Proc. Natl. Acad. Sci. USA, vol. 107, No. 40, pp. 17135-17139 (Oct. 5, 2010).

Warren, W. S., et al., "Increasing Hyperpolarized Spin Lifetimes Through True Singlet Eigenstates," Science, vol. 323, No. 5922, pp. 1711-1714, 11 pages (Mar. 27, 2009).

Tayler, M. C. D. and Levitt, M. H., "Singlet nuclear magnetic resonance of nearly-equivalent spins," Phys. Chem. Chem. Phys., Feb. 11, 2011, vol. 13, pp. 5556-5560.

Torres, A. M., et al., "Diffusion-diffraction using singlet spin states and various NMR coherences in a J-coupled AX spin system," RSC Advances, Jan. 13, 2012, vol. 2, Issue 8, pp. 3352-3360.

* cited by examiner

CREATION OF NEARLY-EQUIVALENT NUCLEAR SPIN SINGLET STATES USING SPIN-LOCK INDUCED CROSSING

REFERENCE TO RELATED APPLICATION

This application is a § 371 U.S. national stage application of International Application No. PCT/US14/019897, filed on Mar. 3, 2014 and claims priority under 35 U.S.C. § 119(e) to U.S. Provisional Application No. 61/780,033 filed on Mar. 13, 2013, the entire contents of both of which are incorporated herein by reference.

FIELD OF THE INVENTION

The invention relates generally to the field Nuclear Magnetic Resonance (NMR). In particular, the invention relates to NMR techniques utilizing spin-locking.

BACKGROUND

Nuclear magnetic resonance (NMR) spectroscopy can be used as a tool for determining the chemical structure and/or geometry of a molecule in a sample. In many samples, however, resonance frequencies of different nuclei fully or partially overlap, which makes chemical identification of molecule(s) in a sample difficult or impossible.

Nuclear singlet states are non-magnetic states of nuclear spin pairs that may exhibit extraordinarily long lifetimes. The long lifetime suggests that nuclear singlet states can be used to the study a variety of processes, e.g., slow motions, chemical exchange and transport of hyperpolarized spin order. Moreover, singlet states can also be used as a quantum filter to target molecules hidden in a complicated spectrum, as demonstrated with a pulse sequence referred to as "SUCCESS." The rate of singlet decay has also been shown to carry information on the locations of neighboring magnetic nuclei.

Nuclear spin singlet states in proton pairs can exhibit lifetimes much longer than the spin lattice relaxation time, $T_1$. Such states exist naturally when nuclear spins are strongly coupled relative to their resonance frequency differences, i.e., $J \gg \Delta v$. However, due to the differences in singlet and triplet symmetries, it is not possible to transfer magnetization to the singlet state by directly driving a radiofrequency transition. Tayler and Levitt demonstrated that such a transfer can instead be achieved using a series of $\pi$-pulse trains in which the pulse timing is synchronized to the J-coupling strength between nuclei (Tayler et al., *Physical Chemistry Chemical Physics* 13, 5556(2011)). This "M2S" sequence takes advantage of the small amount of mixing between singlet and triplet states that is present whenever $\Delta v > 0$. Feng and Warren also showed that the sequence can create singlet states in certain heteronuclear systems even when the nuclear spins are identical (Fen et al., *Nature Physics* 8, 831 (2012)). These sequences hold promise for creating hyperpolarized singlet states without the need for a chemical reaction or continuous spin-locking (Warren et al., *Science* 323, 1711 (2009)). However, in both implementations, the transfer to singlet state only occurs during the final third of the sequence time, and before this stage the total magnetization is present in states subject to conventional spin-lattice relaxation.

SUMMARY OF THE INVENTION

This invention is based, in part, on the discovery that that weak spin locking can drive transitions between dressed states of a multi-spin system.

It is understood that any of the embodiments described below can be combined in any desired way, and any embodiment or combination of embodiments can be applied to each of the aspects described below.

In one aspect, the invention provides a method comprising selectively creating a nuclear spin singlet state in a target molecule by applying spin-locking with a nutation frequency matched to the J-coupling between two nuclei of interest for a duration appropriate for the resonance frequency difference between the nuclei of interest.

In some embodiments, the magnetization is transferred from a triplet state to the singlet state during spin-locking.

In some embodiments, the method further comprises allowing the nuclear spin singlet state to evolve for a predetermined period of time.

In some embodiments, the method further comprises transferring the nuclear spin singlet state back to transverse magnetization by applying the spin-locking with the nutation frequency matched to the J-coupling between two nuclei of interest for a duration appropriate for the resonance frequency difference between the nuclei of interest.

In some embodiments, the method further comprises detecting the nuclear spin singlet state.

In some embodiments, the spin-locking comprises applying a weak radio frequency (RF) field.

In some embodiments, the method is carried out by selectively applying a pulse sequence to the target molecule, the pulse sequence having parameters that are optimized for creating nuclear spin singlet states.

In another aspect, the invention provides a method for acquiring a J-coupling information containing spectrum of a target molecule comprising measuring magnetization transfer between spin states as a function of the spin-lock nutation frequency.

In some embodiments, the method further comprises measuring magnetization as a function of spin lock duration time.

In some embodiments, the method further comprises generating the J-coupling information containing spectrum.

In some embodiments, the method further comprises chemically identifying the target molecule based on the generated J-coupling information containing spectrum.

In some embodiments, the target molecule contains at least a pair of strongly-coupled spins.

In some embodiments, the pair of strongly coupled spins are both $^1$H.

In some embodiments, the pair of strongly coupled spins are both $^{13}$C, $^{15}$N, $^{17}$O, $^{19}$F or $^{31}$P.

In some embodiments, the method is performed at a magnetic field strength of less than 2 T or less than 100 mT.

In some embodiments, the method is performed at a magnetic field strength of less than 10 mT.

In yet another aspect, the invention provides a method comprising selectively creating a nuclear spin singlet state in a target molecule having a nearly-equivalent pair of nuclei by applying continuous spin-locking with parameters that are optimized to transfer magnetization from the triplet state to the singlet state.

In some embodiments, the method further comprises transferring magnetization from the singlet state back to the triplet state.

In some embodiments, the method further comprises measuring magnetization as a function of spin lock nutation frequency.

In some embodiments, the method further comprises measuring magnetization as a function of spin lock duration time.

In some embodiments, the resonance frequency difference between the nuclei is less than 1/(spin lattice relaxation time).

In some embodiments, the pair of nearly-equivalent nuclei are both $^1H$.

In some embodiments, the pair of nearly-equivalent nuclei are both $^{13}C$, $^{15}N$, $^{17}O$, $^{19}F$ or $^{31}P$.

In some embodiments, the method is performed at a magnetic field strength of more than 2 T.

In some embodiments, the method is performed at a magnetic field strength of more than 2 T but less than 26 T.

In some embodiments, the method is performed at a magnetic field strength of more than 4.5 T.

In still another aspect, the invention provides a nuclear magnetic resonance (NMR) system comprising: (a) an NMR transceiver including a radiofrequency (RF) generator configured to generate a sequence of RF fields having controllable parameters, and to apply the RF field sequence to a sample; and (b) a controller configured to generate and optionally relay a set of instructions to the transceiver to perform the method.

Figure 4:
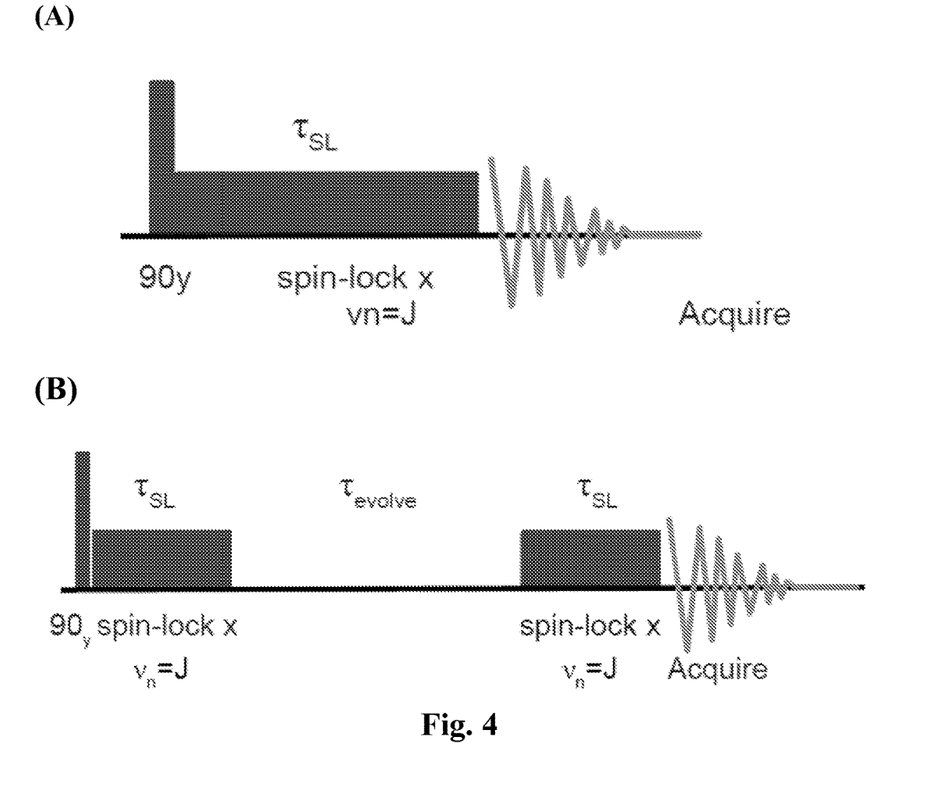
FIG. 4 illustrates a typical experiment using the SLIC sequence to create singlet by applying spin-locking with the nutation frequency matched to the J-coupling for a duration appropriate for the resonance frequency difference. (A) The acquisition can be performed directly following singlet creation to detect the corresponding drop in x-axis magnetization, or (B) the system can be allowed to evolve, and singlet can be converted back to transverse magnetization for readout by applying spin-locking a second time.
Figure 9:
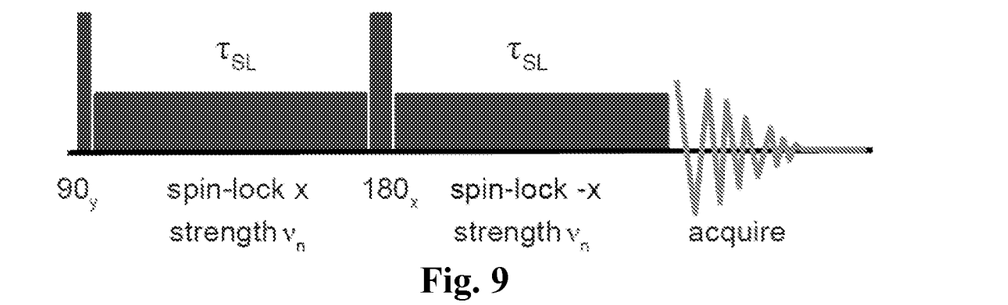
FIG. 9 is a representation of an alternative embodiment of the SLIC pulse sequence, in which the spin locking is divided into two sections of equal length with a 180° pulse performed between the sections.

In some embodiments, the RF field sequence is a pulse sequence depicted in FIG. 4 or FIG. 9.

In yet another aspect, the invention provides a system comprising a computer readable medium including instructions that when executed cause an NMR transceiver including an RF generator to generate a sequence of RF fields to perform the method.

In some embodiments, the sequence of RF fields is a pulse sequence depicted in FIG. 4 or FIG. 9.

BRIEF DESCRIPTION OF THE DRAWINGS

FIG. 1 is a graphic representation of simulations for the δ=3.71 ppm proton pair in phenylalanine-glycine-glycine. The M2S experiment: (A) A typical experiment uses the M2S sequence to create singlet by applying pulse trains with the appropriate length and pulse spacing synchronized with the J-coupling and resonance frequency difference. The system is then allowed to evolve, and the M2S sequence is applied in reverse order to convert singlet back to transverse magnetization for readout. (B) A simulation reveals the transfer of magnetization from the x-axis to singlet-triplet coherences and finally to singlet population in a series of stages. The SLIC experiment: During a SLIC sequence, x-magnetization is spin-locked at $v_n=J$ to transfer magnetization to the singlet. (C) SLIC is used to create the singlet, which is allowed to evolve and then is transferred back to transverse magnetization using an identical spin-locking strength and duration. (D) A simulation reveals that transfer to singlet population begins immediately and occurs in a single stage.

FIG. 3 shows application of SLIC to the δ=3.71 ppm proton pair of the Phe-Gly-Gly tripeptide: (A) The x-axis magnetization was measured following the first SLIC spin-lock. A pronounced dip appears when the spin-lock frequency equals J. Here, Lorentzians are fit to measurements taken at two different spin-lock durations. (B) The singlet intensity after $T_{evolve}=5$ s was measured with the SLIC sequence in FIG. 1C. The amount of singlet produced and read out is dependent on the spin-lock duration $\tau_{SL}$. 5=3.20 ppm proton pair: (C) The x-axis magnetization was measured following a SLIC spin-lock of 328 ms duration. A Lorentzian is fit to the data. (D) The singlet intensity after $T_{evolve}=500$ ms was measured with the SLIC sequence of FIG. 1C. Once again, the amount of singlet produced and read out is dependent on the spin-lock duration $\tau_{SL}$.

DETAILED DESCRIPTION OF THE INVENTION

The patent and scientific literature referred to herein establishes knowledge that is available to those of skill in the art. The issued U.S. patents, allowed applications, published foreign applications, and references that are cited herein are hereby incorporated by reference to the same extent as if each was specifically and individually indicated to be incorporated by reference.

As used herein, the recitation of a numerical range for a variable is intended to convey that the invention may be practiced with the variable equal to any of the values within that range. Thus, for a variable which is inherently discrete, the variable can be equal to any integer value within the numerical range, including the end-points of the range. Similarly, for a variable which is inherently continuous, the variable can be equal to any real value within the numerical range, including the end-points of the range. As an example, and without limitation, a variable which is described as having values between 0 and 2 can take the values 0, 1 or 2 if the variable is inherently discrete, and can take the values 0.0, 0.1, 0.01, 0.001, or any other real values ≥0 and ≤2 if the variable is inherently continuous.

In the present application, reference to an element in the singular is not intended to mean "one and only one" unless specifically so stated, but rather "one or more." All structural and functional equivalents to the elements of the various embodiments described throughout this disclosure, known or later come to be known to those of ordinary skill in the art, are expressly incorporated herein by reference.

As used herein, unless specifically indicated otherwise, the word "or" is used in the inclusive sense of "and/or" and not the exclusive sense of "either/or."

The inventors have unexpectedly discovered that weak spin locking can drive transitions between dressed states of the spin system. "Dressed states" are states that are combinations of the product states that are typically used to describe a spin system. The singlet and triplet states are two examples of dressed states, and they are defined by the product states as discussed below.

While, SLIC can drive transitions between the singlet and triplet, it can be more powerful than that. For example, for molecules in very low magnetic fields, such as the 6.5 mT low-field imager, $J \gg \Delta\nu$ for all the spins. Consequently, one cannot work with the individual spin states of each nucleus, and one needs to work with the new dressed states that result from diagonalizing the Hamiltonian. Since there are usually more than 2 spins involved (ethanol has 5 or 6 depending on whether it is hydrated), the dressed states are normally not singlets and triplets, but are more complicated combinations of many or all the nuclear spins in the molecule. Nevertheless, these states respond much like singlets and triplets to weak spin locking, which leads to transitions between the dressed states at specific spin locking nutation rates. These transitions are detected as dips in FIG. 7.

Figure 8:
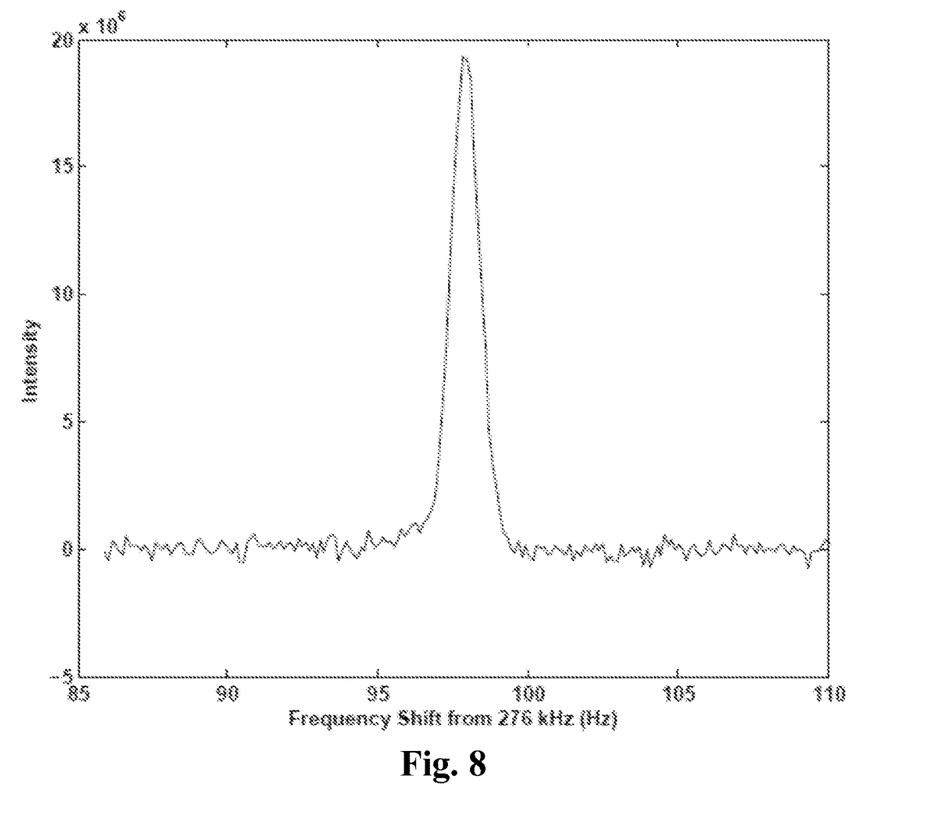
FIG. 8 shows a SLIC spectrum of ethanol at a magnetic field of 6.5 mT.

The spin locking strengths at which the transitions occur depend on the molecular structure and couplings, and can therefore be used to uniquely identify molecules. Molecular identification cannot otherwise be accomplished at very low fields because the linewidth is much larger than the line splitting, resulting in a single resonance line such as in FIG. 8.

It has been discovered that a better transfer efficiency than the "M2S" pulse sequence can be achieved by replacing the pulse trains with a continuous spin-lock in which the nutation frequency is matched to the J-coupling between nuclei. At this spin-locking strength, the energy levels of the singlet state and one triplet state become equal in the rotating frame, so that magnetization transfer can occur. This novel pulse sequence is called "spin-lock induced crossing," or SLIC.

The crossing is analogous to the Hartmann-Hahn condition for polarization transfer between two inequivalent nuclei, except that in this case the nuclei are nearly identical and their spin symmetry subspaces are inequivalent. In SLIC, the transfer to singlet state takes place throughout the course of spin-locking, thereby minimizing losses from relaxation of the triplet states. M2S and SLIC are experimentally compared using the tripeptide phenylalanine-glycine-glycine (phe-gly-gly), which contains two pairs of nearly-equivalent nuclei in which to prepare singlet states, and is found that for these groups singlet state creation with SLIC is 19% and 75% more efficient than M2S. Variation of the pulse sequence parameters allows the estimation of small chemical shift differences that are normally obscured by larger J-couplings and by the linewidth.

Figure 1:
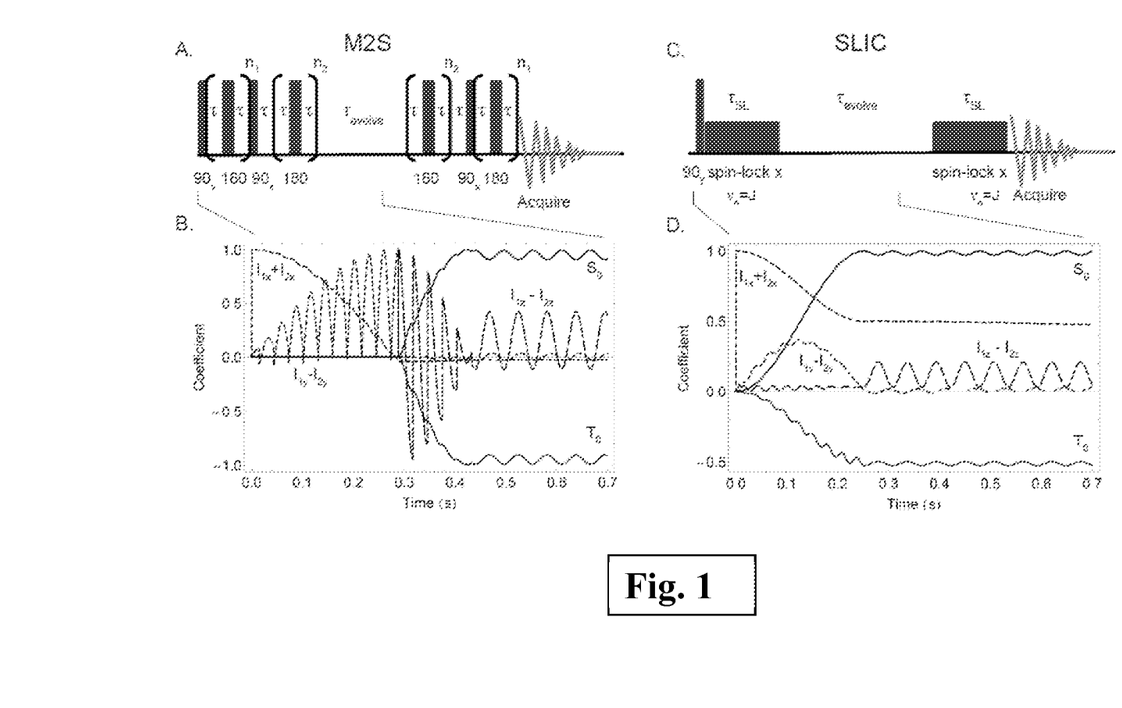

FIG. 1 shows the benefits of SLIC over the M2S pulse sequence. FIG. 1A shows a typical experiment in which the M2S sequence is used to create a singlet state and then return the singlet state to transverse magnetization after an evolution time, $T_{evolve}$.

FIG. 1B shows the results of a simulation using the Spin Dynamica program for a typical singlet state preparation with M2S if relaxation is ignored. The first pulse train converts the magnetization into a singlet-triplet coherence with a relaxation time of $T_2/3 \approx T_1/3$, and the second pulse train creates a singlet population, with a relaxation time $T_S$. The number of pulses required for the M2S sequence increases as the resonance frequency difference between spins, $\Delta\nu$, decreases and the singlet becomes closer to ideal. In many cases, the required sequence time approaches or exceeds $T_1$ of the nuclei and significant magnetization can be lost before it is transferred to the singlet state, particularly during the first ⅔ of the sequence. For an ideal system, the time required for maximum singlet state creation is:

$$t_{M2S,max} \approx \frac{3\pi}{8\Delta\nu} = \frac{1.18}{\Delta\nu}. \quad \text{(Eq. 1)}$$

FIG. 1C shows another embodiment of the SLIC sequence to create singlet state and return it to transverse magnetization after an evolution time, in analogy to the M2S experiment. Instead of pulse trains, continuous spin-locking is applied at a nutation frequency equal to the J-coupling between spins, i.e., $\nu_n = J$. The simulation shown in FIG. 1D reveals that the spin-locking transfers magnetization directly from the x-axis into singlet population, and that this occurs more quickly than in the M2S sequence. A density matrix analysis shows that selecting a nutation frequency $\nu_n = J$ matches the energies of the singlet state and one of the triplet states, creating a spin-lock induced crossing. At this energy, off-diagonal interaction terms $\Delta\nu/2\sqrt{2}$ become significant and promote magnetization transfer. These cause magnetization to oscillate between triplet and singlet states with a period of $\sqrt{2}/\Delta\nu$, and maximum transfer occurs at half this time $$t_{SL,max} = \frac{1}{\Delta\nu\sqrt{2}} = \frac{0.707}{\Delta\nu}. \quad \text{(Eq. 2).}$$

Figure 2:
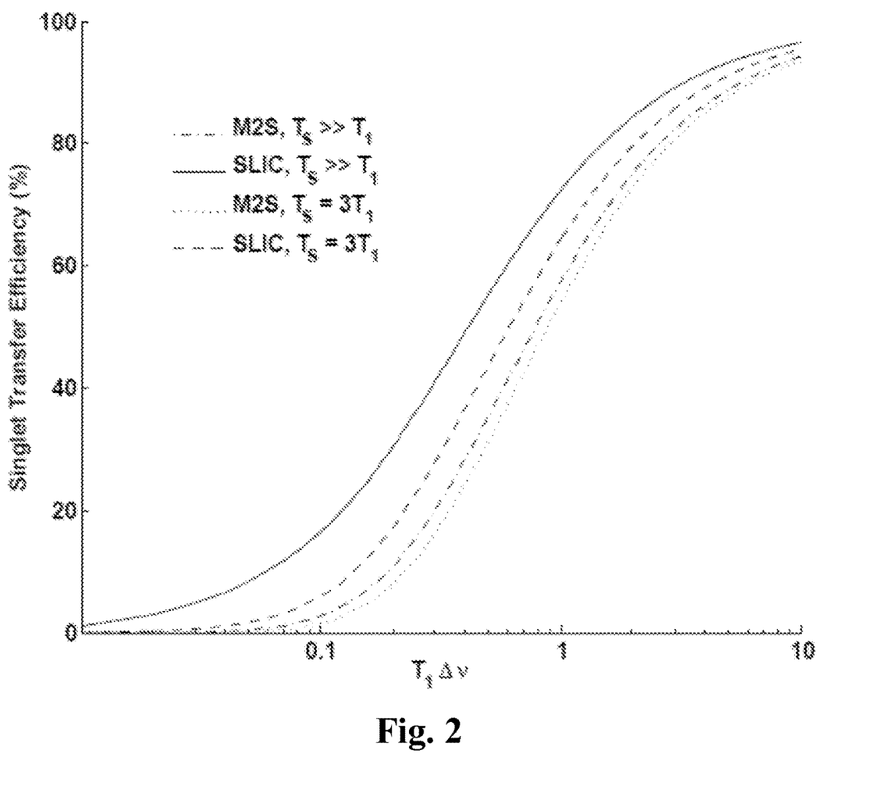
FIG. 2 illustrates simulations of the ideal transfer efficiency for M2S (blue) and SLIC (red). Results are shown for cases in which $T_S \gg T_1$ (solid) and $T_S=3\ T_1$ (dashed).

Comparison with Equation 1 shows that SLIC produces singlet state 40% faster than M2S, which results in fewer relaxation losses. To compare the effectiveness of the two sequences, a simple simulation was performed for each using Bloch equations to model the relaxation and the transfer between states s. M2S was modeled in two steps: first, a transfer from $I_{1x} + I_{2x}$ with lifetime $T_2 = T_1$ to $I_{1y} - I_{2y}$ with lifetime $T_1/3$; second, a transfer from $I_{1z} - I_{2z}$ with lifetime $T_1/3$ to state $S_0$ with lifetime $T_S$. Only one transfer was modeled for SLIC, between $I_{1x} + I_{2x}$ and $S_0$. A maximum of 50% magnetization transfer to singlet state can be achieved by both sequences, which is considered to be an efficiency of 100%. FIG. 2 plots the transfer efficiency as a function of the product $T_1\Delta\nu$. Two cases are considered, one in which $T_S \gg 3T_1$, and one in which $T_S = 3T_1$. While the efficiency of both sequences decrease dramatically when $T_1\Delta\nu < 1$, SLIC becomes much more efficient than M2S in this regime. Both sequences are also less efficient when $T_S/T_1$ is smaller, due to singlet relaxation.

An analysis of a two-spin system during spin-locking explains the mechanism of singlet creation. Consider a system of two coupled spin-½ nuclei with resonance frequencies $\nu_1$ and $\nu_2$, and let $\Delta\nu = \nu_1 - \nu_2$. The two spins have a scalar coupling J, and it will be assumed dipolar couplings are eliminated due to fast reorientation of the molecule, as in liquids. The Hamiltonian for this system written in the singlet/triplet basis is described by $$\mathcal{H}_0 = h \begin{bmatrix} -\frac{v_1+v_2}{2}+\frac{J}{4} & 0 & 0 & 0 \\ 0 & \frac{J}{4} & 0 & \frac{\Delta v}{2} \\ 0 & 0 & \frac{v_1+v_2}{2}+\frac{J}{4} & 0 \\ 0 & \frac{\Delta v}{2} & 0 & -\frac{3J}{4} \end{bmatrix},$$

where the eigenstates are (from left to right) the three triplet states, $|T_-\rangle$, $|T_0\rangle$, and $|T_+\rangle$, and one singlet state, $|S_0\rangle$. These can be represented as symmetric and antisymmetric combinations of the product states:

$$|T_-\rangle = |\uparrow\uparrow\rangle$$

$$|T_0\rangle = \frac{|\uparrow\downarrow\rangle + |\downarrow\uparrow\rangle}{\sqrt{2}}$$

$$|T_+\rangle = |\downarrow\downarrow\rangle$$

$$|S_0\rangle = \frac{|\uparrow\downarrow\rangle - |\downarrow\uparrow\rangle}{\sqrt{2}}.$$

It is convenient to work in the rotating frame at the average resonance frequency of the nuclei, so that $(v_1+v_2)/2=0$. Then $$\mathcal{H}_0 = h \begin{bmatrix} \frac{J}{4} & 0 & 0 & 0 \\ 0 & \frac{J}{4} & 0 & \frac{\Delta v}{2} \\ 0 & 0 & \frac{J}{4} & 0 \\ 0 & \frac{\Delta v}{2} & 0 & -\frac{3J}{4} \end{bmatrix}.$$

If spin-locking is now applied on resonance with the triplet transitions with a nutation frequency $v_n$, the off-diagonal elements are added to the Hamiltonian to produce $$\mathcal{H}_{SL} = h \begin{bmatrix} \frac{J}{4} & \frac{v_n}{\sqrt{2}} & 0 & 0 \\ \frac{v_n}{\sqrt{2}} & \frac{J}{4} & \frac{v_n}{\sqrt{2}} & \frac{\Delta v}{2} \\ 0 & \frac{v_n}{\sqrt{2}} & \frac{J}{4} & 0 \\ 0 & \frac{\Delta v}{2} & 0 & -\frac{3J}{4} \end{bmatrix}.$$

Since the spin-locking is on for a long time relative to a precession period, it is best to rediagonalize the triplet states and study the resulting dressed states. The new dressed-state Hamiltonian is $$\mathcal{H}_{SL,dressed} = h \begin{bmatrix} \frac{J}{4}-v_n & 0 & 0 & \frac{\Delta v}{2\sqrt{2}} \\ 0 & \frac{J}{4} & 0 & 0 \\ 0 & 0 & \frac{J}{4}+v_n & -\frac{\Delta v}{2\sqrt{2}} \\ \frac{\Delta v}{2\sqrt{2}} & 0 & -\frac{\Delta v}{2\sqrt{2}} & -\frac{3J}{4} \end{bmatrix}.$$

and the resulting dressed states are $$|\phi_-\rangle = \frac{1}{2}(|\uparrow\uparrow\rangle + |\downarrow\downarrow\rangle - |\uparrow\downarrow\rangle - |\downarrow\uparrow\rangle)$$
$$= \frac{1}{2}(|T_-\rangle + |T_+\rangle) - \frac{1}{\sqrt{2}}|T_0\rangle$$

$$|\phi_0\rangle = \frac{1}{\sqrt{2}}(|\downarrow\downarrow\rangle - |\uparrow\uparrow\rangle) = \frac{1}{\sqrt{2}}(|T_+\rangle - |T_-\rangle)$$

$$|\phi_+\rangle = \frac{1}{2}(|\uparrow\downarrow\rangle + |\downarrow\uparrow\rangle + |\uparrow\uparrow\rangle + |\downarrow\downarrow\rangle)$$
$$= \frac{1}{2}(|T_-\rangle + |T_+\rangle) + \frac{1}{\sqrt{2}}|T_0\rangle$$

$$|\phi_S\rangle = \frac{1}{\sqrt{2}}(|\uparrow\downarrow\rangle - |\downarrow\uparrow\rangle) = |S_0\rangle.$$

The states $|\phi_0\rangle$ and $|\phi_S\rangle$ are split by energy J and are unaffected by the strength of spin-locking, whereas the energy of states $|\phi_-\rangle$ and $|\phi_+\rangle$ have a linear dependence on $v_n$.

It is now evident that selecting a nutation frequency $v_n=J$ will match the energies of states $|\phi_-\rangle$ and $|\phi_S\rangle$, creating a spin-lock induced crossing. At this energy, the off-diagonal interaction terms $\Delta v/2\sqrt{2}$ become significant and promote magnetization transfer. These cause magnetization to oscillate between triplet and singlet states with a period of $\sqrt{2}/\Delta v$, and maximum transfer occurs at half this time $$t_{SL,max} = \frac{1}{\Delta v \sqrt{2}} = \frac{0.707}{\Delta v}.$$

The proton NMR spectrum of phenylalanine-glycine-glycine (FIG. 5) reveals that the molecule possesses two sets of nearly-equivalent proton pairs, in which the protons are unresolved ($\delta$=3.20 ppm and $\delta$=3.71), and one proton pair exhibiting a second-order spectrum (centered at $\delta$=3.89 ppm). Each proton of the $\delta$=3.20 ppm pair is split by a third neighboring spin ($\delta$=4.27 ppm) with strength J=7.3 Hz. Spin lattice relaxation times were measured and are summarized in Table 1.

TABLE 1

Spin-lattice relaxation times for the phe-gly-gly protons.

| Chemical Shift ($\delta$) | $T_1$ (ms) |
|---|---|
| 3.20 | 430 ± 5 |
| 3.71 | 912 ± 7 |
| 3.89 | 618 ± 6 |
| 4.27 | 1760 ± 20 |

Figure 6:
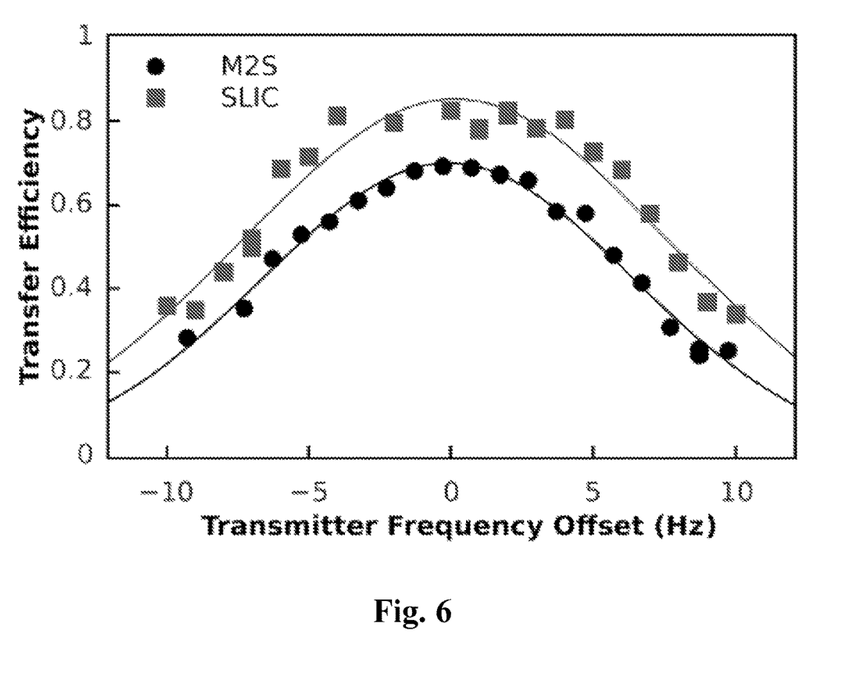
FIG. 6 is a representation of singlet transfer efficiencies for SLIC and M2S that were measured as a function of transmitter frequency offset. SLIC had a higher efficiency and a slightly broader effective bandwidth.

The effectiveness of M2S and SLIC was compared using off-resonant transmitter frequencies. Singlet creation and readout sequences were performed using both M2S and SLIC at a number of transmitter frequency offsets with a constant $\tau_{evolve}$=500 ms the transfer efficiency was measured. The resulting curves were fit with a Gaussian to determine a full-width half max (FWHM) effective bandwidth (FIG. 6). The effective bandwidth was similar for both sequences, with FWHM bandwidths of 17.6±0.6 Hz for SLIC and 15.3±0.3 Hz for M2S.

Next, demonstration of an improved method for the transfer of magnetization between singlet and triplet states of nearly-equivalent nuclei is described. The SLIC sequence is found to be 19% and 75% more efficient than M2S for the two cases measured. Since many nuclear singlet state experiments require the sequence to be applied twice, once for preparation and once for readout, these efficiency improvements translate to even larger gains in the final signal strength. SLIC is more effective than M2S primarily because the transfer to the long-lived singlet state begins immediately, without the need for an initial transfer to a singlet-triplet coherence. While the singlet-triplet coherence has an extended lifetime, it generally relaxes significantly faster than the singlet population. This leads to significant relaxation during the first stage of M2S, especially for molecules with extremely small $\Delta v$, in which $1/\Delta v$ can be much longer than $T_1$. These are the very molecules expected to possess the longest singlet state lifetimes.

Outside liquid-state NMR, SLIC can be used in long-lived quantum memories composed of spin pairs, as well as in solid state spin measurements made with NV diamond magnetometers. In the case of a quantum memory with singlet and triplet bases, SLIC provides a straightforward way to prepare the desired states within the singlet/triplet Bloch sphere. For spin state measurements of nuclear spins at low magnetic fields, such as those proposed for NV diamond magnetometers, nuclei are strongly coupled and exhibit no resolvable spectral information. However, SLIC can be used to mix the nuclear spin states, based on the weak chemical shift differences that still exist, and thereby modulate the nuclear signals in a spectrally-selective way.

In some embodiments, the techniques described herein are applied to low-field NMR spectrometers. Such low-field NMR spectrometers generally include instruments with magnetic field of 2 T or lower, e.g., 1.5 T, 1 T and 0.5 T. In general, techniques described can be used in NMR spectrometers operating at $^1$H Larmor frequencies between about 2 MHz and 0.5 kHz, for example about 1.5 MHz, 1 MHz, 0.5 MHz, 0.4 MHz, 0.3 MHz, 0.2 MHz, 0.1 MHz, 50 kHz, 40 kHz, 30 kHz, 20 kHz, 10 kHz, 5 kHz, 3 kHz, 2 kHz, 1 kHz, 0.9 kHz, 0.8 kHz, 0.7 kHz, 0.6 kHz or 0.5 kHz. Of course, these techniques can also be used in NMR spectrometers operating at 1H Larmor frequencies higher than 400 MHz. These techniques may be of particular interest for NMR spectrometers that do not require a cryo-cooled magnet for operation, e.g., bench-top or clinical NMR spectrometers.

In some embodiments, the techniques described herein can be used to generate a spectral library of compounds of interest that are present in a mixture.

In some embodiments, the techniques described herein can be used for process control. Process control includes monitoring reaction progress, sampling of batches for purity, presence of reactants or products, or quantitation of reactants, products, or intermediates. Such processes can be used in industrial processes, for example, in syntheses of petroleum products, biodiesel, and biopharmaceuticals. Techniques described herein can also be used by scientists for bench-top analysis of molecular structures, product purity, or reaction kinetics.

The techniques and systems disclosed herein may be implemented as a system or as a computer program product for use with a computer system or computerized electronic device. Such implementations may include a series of computer instructions, or logic, fixed either on a tangible medium, such as a computer readable medium (e.g., a diskette, CD-ROM, ROM, flash memory or other memory or fixed disk) or transmittable to a computer system or a device, via a modem or other interface device, such as a communications adapter connected to a network over a medium.

The medium may be either a tangible medium (e.g., optical or analog communications lines) or a medium implemented with wireless techniques (e.g., Wi-Fi, cellular, microwave, infrared or other transmission techniques). The series of computer instructions embodies at least part of the functionality described herein with respect to the system. Those skilled in the art should appreciate that such computer instructions can be written in a number of programming languages for use with many computer architectures or operating systems.

Furthermore, such instructions may be stored in any tangible memory device, such as semiconductor, magnetic, optical or other memory devices, and may be transmitted using any communications technology, such as optical, infrared, microwave, or other transmission technologies.

It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).

The components, steps, features, objects, benefits and advantages that have been disclosed above are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages.

Nothing that has been stated or illustrated is intended to cause a dedication of any component, step, feature, object, benefit, advantage, or equivalent to the public. While the specification describes particular embodiments of the present application, those of ordinary skill can devise variations of the present application without departing from the inventive concepts disclosed in the disclosure.

This invention is further illustrated by the following examples, which should not be construed as limiting. Those skilled in the art will recognize, or be able to ascertain, using no more than routine experimentation, numerous equivalents to the specific substances and procedures described herein. Such equivalents are intended to be encompassed in the scope of the claims that follow the examples below.

EXAMPLES

Example 1

FIG. 1A shows a typical experiment in which the M2S sequence is used to create a singlet state and then return the singlet state to transverse magnetization after an evolution time, $\tau_{evolve}$. FIG. 1B shows the results of a simulation using the Spin Dynamica program for a typical singlet state preparation with M2S if relaxation is ignored. The first pulse train converts the magnetization into a singlet-triplet coherence with a relaxation time of $T_2/3 \approx T_1/3$, and the second pulse train creates a singlet population, with a relaxation time $T_S$. The number of pulses required for the M2S sequence increases as the resonance frequency difference between spins, $\Delta v$, decreases and the singlet becomes closer to ideal. In many cases, the required sequence time approaches or exceeds $T_1$ of the nuclei and significant magnetization can be lost before it is transferred to the singlet state, particularly during the first ⅔ of the sequence. For an ideal system, the time required for maximum singlet state creation is $$t_{M2S,max} \approx \frac{3\pi}{8\Delta v} = \frac{1.18}{\Delta v}$$

FIG. 1C shows the implementation of the SLIC sequence to create singlet state and return it to transverse magnetization after an evolution time, in analogy to the M2S experiment. Instead of pulse trains, continuous spin-locking is applied at a nutation frequency equal to the J-coupling between spins, i.e., $v_n = J$. The simulation shown in FIG. 1D reveals that the spin-locking transfers magnetization directly from the x-axis into singlet population, and that this occurs more quickly than in the M2S sequence. A density matrix analysis shows that selecting a nutation frequency $v_n = J$ matches the energies of the singlet state and one of the triplet states, creating a spin-lock induced crossing. At this energy, off-diagonal interaction terms $\Delta v/2\sqrt{2}$ become significant and promote magnetization transfer. These cause magnetization to oscillate between triplet and singlet states with a period of $\sqrt{2}/\Delta v$, and maximum transfer occurs at half this time $$t_{SL,max} = \frac{1}{\Delta v \sqrt{2}} = \frac{0.707}{\Delta v}.$$

Comparison with equation 1 shows that SLIC produces singlet state 40% faster than M2S, which results in fewer relaxation losses. To compare the effectiveness of the two sequences, performing a simple simulation for each using Bloch equations to model the relaxation and the transfer between states. M2S was modeled in two steps: first, a transfer from $I_{1x}+I_{2x}$ with lifetime $T_2=T_1$ to $I_{1y}-I_{2y}$ with lifetime $T_1/3$; second, a transfer from $I_{1z}-I_{2z}$ with lifetime $T_1/3$ to state $S_0$ with lifetime $T_S$. Only one transfer was modeled for SLIC, between $I_{1x}+I_{2x}$ and $S_0$. A maximum of 50% magnetization transfer to singlet state can be achieved by both sequences, and considering this to be an efficiency of 100%. FIG. 2 plots the transfer efficiency as a function of the product $T_1\Delta v$. Two cases are considered, one in which $T_S \gg 3T_1$, and one in which $T_S=3T_1$. While the efficiency of both sequences decrease dramatically when $T_1\Delta v<1$, SLIC becomes much more efficient than M2S in this regime. Both sequences are also less efficient when $T_S/T_1$ is smaller, due to singlet relaxation.

Example 2

To demonstrate the utility of SLIC for producing nuclear spin singlet states, NMR measurements were performed at 4.7 T on a 20 mM solution of the tripeptide phenylalanine-glycine-glycine (phe-gly-gly, Sigma Aldrich) in $D_2O$. For comparison, the M2S sequence was first applied to the nearly-equivalent proton pair at $\delta=3.71$ ppm. Optimized parameters for singlet creation was found to be $n_1=10$, $n_2=5$, and $\tau=14.4$ ms. These values indicate J=17.4±0.1 Hz and $\Delta v=2.8$ Hz. A singlet lifetime of $T_S=25.1\pm0.8$ s was measured with no spin-locking applied during $\tau_{evolve}$. The intensity of the remaining magnetization after $T_{evolve}=5$ s was compared with the intensity of a one-pulse spectrum, and using the singlet lifetime to extrapolate the singlet intensity at $T_{evolve}=0$, estimating that 24% of the magnetization was transferred to singlet state and back, out of a theoretical maximum of 50%. The efficiency for each transfer was 69%.

Figure 3:
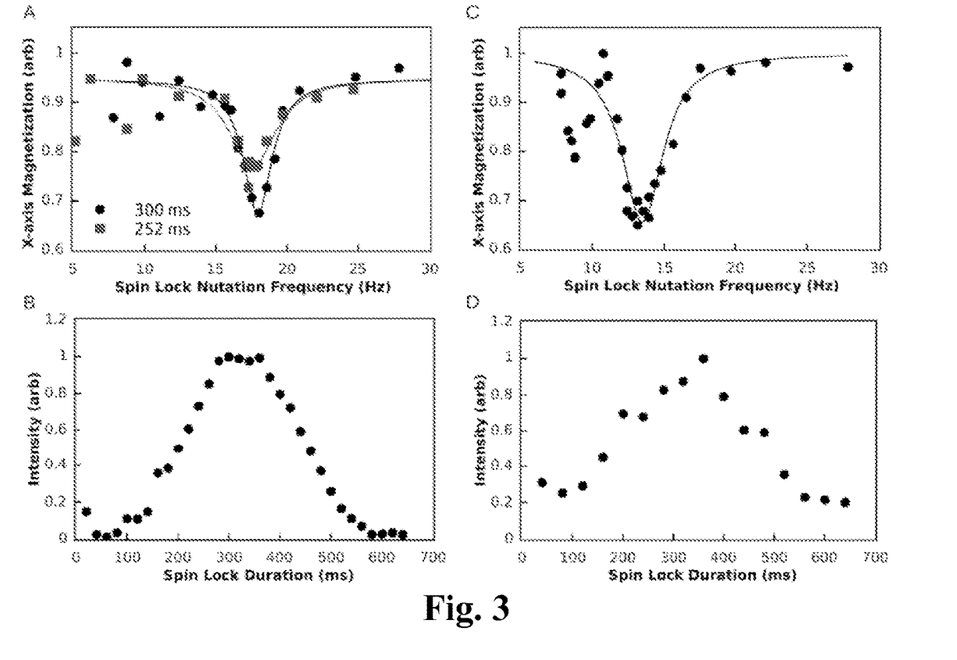

To find the optimal spin-lock nutation frequency for SLIC, a modified SLIC sequence was used in which the signal was acquired directly after the first spin-locking period, which was set to 252 ms. When $M_x$ was measured as a function of nutation frequency, the expected dip appeared centered at 17.5±0.3 Hz, with a depth of 23% (FIG. 3A). This spin-lock nutation frequency was then used in the complete sequence (FIG. 1C) and $\tau_{SL}$ was optimized to produce the strongest signal at $T_{evolve}=5$ s. The result (FIG. 3B) was a flat-topped curve for the intensity as a function of spin-lock duration, with a flat maximum between 280 and 360 ms. A value $\tau_{SL}=300$ ms was subsequently used, which produced 34% magnetization transfer to singlet state and back when extrapolated to $T_{evolve}=0$, indicating an efficiency of 82% for each transfer.

Singlet state creation on the proton pair at $\delta=3.20$ ppm was investigated. This pair is coupled to a third proton, which decreases the singlet state lifetime and singlet state transfer efficiency. The SLIC sequences was applied to find an optimal spin-lock nutation frequency and J-coupling of 13.5±0.2 Hz, with an optimal spin-lock duration of 328±7 ms (FIGS. 3C & D). The corresponding resonance frequency difference is 2.16 Hz. A singlet lifetime of $T_S=2.15\pm0.05$ s for this proton pair was measured. The maximum magnetization transferred to singlet state and back after 500 ms, extrapolated to $T_{evolve}=0$, was 12%, representing a singlet state transfer efficiency of 49%.

The parameters measured with SLIC suggested optimal M2S values of $\tau=18.5$ ms, $n_1=10$, and $n_2=5$. However, Spin Dynamica simulations showed that the weakly-coupled third spin produces a long-term intensity oscillation that should change the optimal $n_1$ to 8 cycles. Optimal parameters of $\tau=17.9$ ms, $n_1=4$, and $n_2=5$ was experimentally determined. The lower number of loops for the first stage is likely a consequence of the short T1 time of the protons. With M2S, only 4% of the polarization was transferred to singlet state and back at $T_{evolve}=0$, representing an efficiency of 28%.

Example 3

Measurements were performed on a 20 mM solution of the tripeptide phenylalanine-glycine-glycine (phe-gly-gly, Sigma Aldrich) prepared in $D_2O$. Nitrogen gas was bubbled through the solution for 5 minutes to displace dissolved oxygen. Proton NMR spectra were acquired with a Bruker 4.7 T spectrometer at 200 MHz. A reference spectrum was acquired with one 90 degree pulse followed by an FID acquisition. The spin-lattice relaxation time, $T_1$, was measured for each nucleus using an inversion recovery sequence.

Pulse sequences to implement SLIC are shown in FIGS. 4A and 4B. The transmitter frequency is set to the average resonance frequency of the proton pair of interest. A $\pi/2$ pulse is applied to create a coherence between $(|T_-\rangle + |T_+\rangle)\sqrt{2}$ and $|T_0\rangle$. Next, the phase is shifted 90 degrees and spin-locking is applied with a nutation frequency $v_n=J$. In the resulting dressed state, the previous coherence is now a population difference between $|\phi_-\rangle$ and $|\phi_+\rangle$. After a time $\tau_{SL}=0.707/\Delta v$, this is converted to a population difference between $|\phi S\rangle$ and $|\phi_+\rangle$. Spin-locking is then removed. In FIG. 4A, an acquisition is performed immediately to measure the x-axis magnetization, $M_x$, whereas in FIG. 4B the system is allowed to evolve for duration $\tau_{evolve}$ and both the singlet and triplet states are allowed to relax.

The remaining singlet magnetization is then read out by applying spin-locking again at 90 degrees phase with power $v_n=J$ for time $\tau_{SL}$ and then acquiring an FID at phase 0. Phase cycling is performed to remove residual triplet magnetization by inverting the phase of the π/2 pulse and the acquisition. The singlet state lifetime is found by measuring the remaining singlet population for a range of $\tau_{evolve}$ and fitting to a single exponential decay.

For comparison, an experiment using Levitt's M2S sequence for preparation and readout of the singlet state was performed, with the pulse sequence drawn in FIG. 1A of the main text. The single delay time used in the M2S sequence is set to τ=1/4J, and the number of cycles for the first and second pulse trains are $n_1=\pi/2\theta$ and $n_2=\pi/4\theta$, where θ is the rotation out of the singlet-triplet basis caused by the resonance frequency difference. This rotation depends on the ratio of Δv to J and is given by $$\theta = \tan^{-1}\frac{\Delta v}{J}.$$

The singlet creation for SLIC was optimized using both sequences of FIG. 4 by scanning $v_n$ and $\tau_{SL}$ and measuring the magnetization at the end of each sequence. For the M2S sequence, parameters were optimized by scanning τ, $n_1$, and $n_2$ and measuring the magnetization remaining at the end of the sequence.

Example 4

Spectrum of Phenylalanine-Glycine-Glycine

Figure 5:
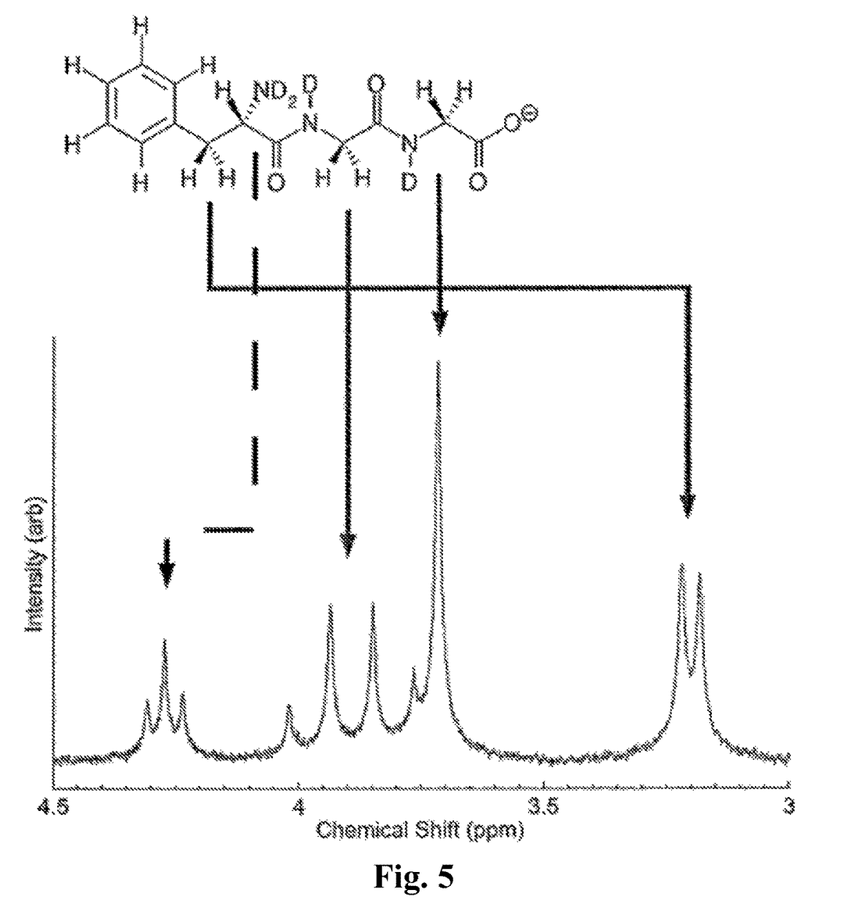
FIG. 5 is a representation of the phenylalanine-glycine-glycine tripeptide structure with its corresponding spectrum at 200 MHz. The aromatic proton resonances occurs near 7.3 ppm and are not shown. Line broadening of 0.1 Hz was applied.

The proton NMR spectrum of phenylalanine-glycine-glycine in FIG. 5 reveals that the molecule possesses two sets of nearly-equivalent proton pairs, in which the protons are unresolved (δ=3.20 ppm and δ=3.71), and one proton pair exhibiting a second-order spectrum (centered at δ=3.89 ppm). Each proton of the δ=3.20 ppm pair is split by a third neighboring spin (δ=4.27 ppm) with strength J=7.3 Hz. Spin lattice relaxation times were measured and are summarized in Table 2.

TABLE 2

Spin-lattice relaxation times for the phe-gly-gly protons.

| Chemical Shift (δ) | $T_1$ (ms) |
|---|---|
| 3.20 | 430 ± 5 |
| 3.71 | 912 ± 7 |
| 3.89 | 618 ± 6 |
| 4.27 | 1760 ± 20 |

Example 5

Effective Bandwidth of M2S and SLIC

Effectiveness of M2S and SLIC using off-resonant transmitter frequencies was compared. Singlets creation and readout sequences were performed using both M2S and SLIC were created at a number of transmitter frequency offsets with a constant $\tau_{evolve}=500$ ms and the transfer efficiency was measured. The resulting curves were fit with a Gaussian to determine a full-width half max (FWHM) effective bandwidth (FIG. 6). The effective bandwidth was similar for both sequences, with FWHM bandwidths of 17.6±0.6 Hz for SLIC and 15.3±0.3 Hz for M2S.

Example 6

Figure 7:
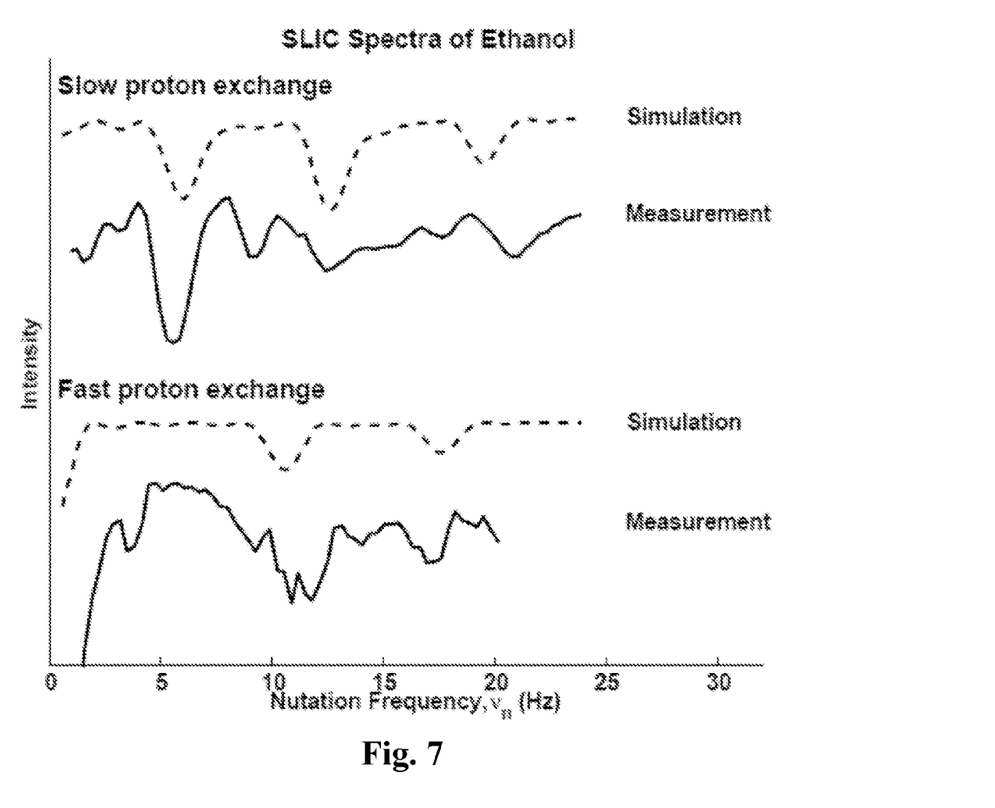
FIG. 7 is a representation of SLIC J-coupling spectra of ethanol were acquired at 6.5 mT by measuring the remaining X-axis magnetization after 1 s of spin locking. Measurements acquired in 0.3 Hz steps show either 2 or 3 major dips, depending on whether the ethanol is hydrated or dehydrated, and therefore whether chemical exchange is slow enough for the alcohol proton to couple with the aliphatic protons.

The strong-coupling condition is commonly encountered in homonuclear spin systems at low magnetic fields, where conventional NMR sequences detect a single spectral peak with no distinguishing spectral information. SLIC allows a J-coupling spectrum to be acquired, without the addition of a heteronucleus, by measuring the magnetization transfer between states as a function of the spin-lock nutation frequency. Using SLIC, J-coupling spectra of both hydrated and dehydrated ethanol at 6.5 mT field strength were produced, which showed a strong agreement with simulations (FIG. 7). This makes chemical identification possible despite the lack of resolvable chemical shifts.

Example 7

SLIC J-coupling spectra of ethanol were acquired on a home-built 6.5 mT spectrometer with a customized Tecmag console, using the pulse sequence shown in FIG. 9. There is a 90° pulse that moves the magnetization to the x axis, followed by a period of spin locking and then acquisition to measure the amount of magnetization that remains along the x axis. The sequence is similar to that of FIG. 4A, except that the spin locking is divided into two sections of equal length with a 180° pulse performed between the sections. The first two spin locking sections are also 180° out of phase. This removes artifacts that may sometimes be observed with the pulse sequence of FIG. 4A.

Measurements were made across a range of spin locking nutation frequencies in 0.3 Hz steps. The total spin locking time per measurement was 1 second and the free-induction decay (FID) acquisition time was 8 seconds. The FID was baseline corrected, apodized to 1 Hz, and Fourier transformed. The peak intensity was then plotted as a function of spin lock nutation frequency to create the J-coupling spectrum. The data were smoothed with a 3-point moving window average. The dehydrated sample consisted of 99.9% ethanol, while the hydrated sample consisted of 90% ethanol and 10% deionized water. Reagents were purchased from Sigma-Aldrich.

What is claimed is:

1. A method comprising selectively creating a nuclear spin singlet state in a target molecule by applying spin-locking with a nutation frequency matched to the J-coupling between two nuclei of interest for a duration appropriate for the resonance frequency difference between the nuclei of interest.

2. The method of claim 1, wherein magnetization is transferred from a triplet state to the singlet state during spin-locking.

3. The method of claim 1, further comprising allowing the nuclear spin singlet state to evolve for a predetermined period of time.

4. The method of claim 3, further comprising transferring the nuclear spin singlet state back to transverse magnetization by applying the spin-locking with the nutation frequency matched to the J-coupling between two nuclei of interest for a duration appropriate for the resonance frequency difference between the nuclei of interest.

5. The method of claim 1, further comprising detecting the nuclear spin singlet state.

6. The method of claim 1, wherein spin-locking comprises applying a weak radio frequency (RF) field.

7. The method of claim 1, wherein the method is carried out by selectively applying a pulse sequence to the target molecule, the pulse sequence having parameters that are optimized for creating nuclear spin singlet states.

* * * * *